United States Patent [19]
Suzuki

[11] Patent Number: 5,875,137
[45] Date of Patent: *Feb. 23, 1999

[54] SEMICONDUCTOR MEMORY DEVICE EXTERNALLY CONFIRMABLE OF A CURRENTLY OPERATED TEST MODE

[75] Inventor: Tomio Suzuki, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 681,425

[22] Filed: Jul. 23, 1996

[30] Foreign Application Priority Data

Aug. 15, 1995 [JP] Japan .................................. 7-208188

[51] Int. Cl.$^6$ ...................................................... G11C 7/00
[52] U.S. Cl. ............................................ 365/201; 365/193
[58] Field of Search ................................. 365/201, 193, 365/189.05

[56] References Cited

U.S. PATENT DOCUMENTS 4,334,295  6/1982  Nagami .................................. 365/222
5,327,387  7/1994  Sugiura et al. ..................... 365/189.01
5,347,490  9/1994  Terada et al. ........................... 365/219
5,377,154  12/1994  Takasugi ............................ 365/189.01
5,434,819  7/1995  Matsuo et al. ..................... 365/189.05

FOREIGN PATENT DOCUMENTS 43 36 883 A1  5/1994  Germany .

*Primary Examiner*—David Nelms
*Assistant Examiner*—Michael T. Tran
*Attorney, Agent, or Firm*—McDermott, Will & Emery

[57] ABSTRACT

A burn-in mode setting circuit in a semiconductor memory device renders a burn-in mode detection signal $\phi_{BB}$ active upon detection of a burn-in mode being set according to a first combination of external control signals. A voltage-down circuit responds to the burn-in mode detection signal $\phi_{BB}$ to suppress a voltage-down operation. A burn-in mode state output control circuit renders an operation mode confirmation signal $\phi_{WCBR}$ active upon detection of an external request of confirmation of an operation mode according to a second combination of external control signals during a burn-in mode. An output buffer circuit responds to a signal $\phi_{WCBR}$ to provide a signal according to the burn-in mode detection signal $\phi_{BB}$ to an input/output terminal.

10 Claims, 13 Drawing Sheets

NORMAL OPERATION MODE

BURN-IN MODE

SEMICONDUCTOR MEMORY DEVICE EXTERNALLY CONFIRMABLE OF A CURRENTLY OPERATED TEST MODE

BACKGROUND OF THE INVENTION

1. Field of the Invention

The present invention relates to semiconductor memory devices, and particularly to an architecture for improving the reliability of testing a semiconductor memory device. More particularly, the present invention relates to an architecture of a semiconductor memory device that allows external electrical detection of a current operation of a test mode during a test operation.

2. Description of the Background Art

In accordance with increase in the storage capacity and circuit complexity of a semiconductor memory device, it has become harder to avoid the production of chips with potential defect factors generated during the fabrication process at a stage prior to shipment thereof.

More specifically, there is a possibility of existence of a gate insulation film fault of an MOS transistor which is a component of the semiconductor memory device, an interlayer insulation film fault between interconnections, interconnection faults, and defects caused by particles introduced during the manufacturing process. Such a chip with these defects will become the cause of failure at the so-called "initial failure mode" if shipped directly as a product.

Thus, screening is generally carried out by the so-called "burn-in" testing. In the burn-in testing, a semiconductor memory device is operated under the condition of high temperature and high voltage to render conspicuous the above-mentioned initial defaults to eliminate faulty products prior to shipment. The time required for this burn-in testing is increased in proportion to the memory capacity even when in a simple write/read cycle. Increase in the testing time will directly result in a higher chip cost.

Increase of the testing time is suppressed by an architecture in which a plurality of semiconductor memory devices arranged on a test board are tested concurrently.

It is to be noted that a semiconductor memory device generally operates at a standard power supply voltage of 5 V to account for compatibility with the so-called TTL (Transistor-Transistor-Logic). It has become difficult to reduce the breakdown voltage and ensure reliability of a small transistor. A typical measure is to incorporate a voltage-down circuit that reduces the power supply voltage to an internal power supply voltage of 3.3 V, for example, in a semiconductor memory device with the external power supply voltage still at the level of 5 V.

In order to carry out a burn-in test for such a semiconductor memory device incorporating an internal voltage-down circuit, the operation of the internal voltage-down circuit must be interrupted and operate the internal circuitry of semiconductor memory device at the external power supply voltage. For this purpose, a particular test mode circuit is incorporated at a burn-in testing by the manufacturer, which is not used by the user side. This particular test mode circuit serves to render the operation of the semiconductor memory device to a test mode according to an external control signal. More specifically, upon sensing designation of a burn-in test mode by an external control signal, a signal is generated to suppress the operation of the internal voltage-down circuit.

This method of rendering a semiconductor memory device to a predetermined test mode by an external control signal is not limited to a burn-in test, and is carried out for other various testings.

When a plurality of semiconductor memory devices are tested concurrently in a burn-in test, each semiconductor memory device must be set to a burn-in test mode by an external control signal. If there is a semiconductor memory device that is not set to a burn-in test mode due to erroneous operation or the like, that semiconductor memory device will operate at the internal power supply voltage that is generated by the internal voltage-down circuit even if attempt is made to operate at the increased external power supply voltage. In such a state, the object of effecting accelerated testing in the burn-in test mode cannot be achieved. Therefore, reliability of the result of the burn-in testing will be degraded.

Conventionally, in a burn-in test of a semiconductor memory device including a voltage-down circuit, the difference of the power consumption of each semiconductor memory device in a normal operation and in a burn-in operation is measured to determine whether the semiconductor memory device is set to a burn-in mode or not.

For a conventional semiconductor memory device, there was no method of easily determining whether a semiconductor memory device is set to a particular test mode or not during operation of the particular test mode such as a burn-in test.

If determination according to difference in the power consumption is carried out for each semiconductor memory device, the testing time will be increased. Furthermore, the determination of whether a burn-in test mode is set or not must be appropriately monitored even during the burn-in testing. This method will further increase the testing time period, which in turn causes increase in the chip cost.

SUMMARY OF THE INVENTION

An object of the present invention is to provide a semiconductor memory device that can easily be determined from the outside world whether the semiconductor memory device is set to a particular test such as a burn-in test mode.

Another object of the present invention is to provide a semiconductor memory device that allows external confirmation of a particular test mode setting without degrading the readout rate of a normal semiconductor memory device.

A semiconductor memory device according to an aspect of the present invention includes a memory cell array, a memory cell selection circuit, a mode detection circuit, an operation confirmation circuit, and an output buffer circuit.

The memory cell array includes a plurality of memory cells arranged in a matrix. The memory cell selection circuit reads out stored data from a corresponding memory cell according to an external address signal. The mode detection circuit responds to an operation mode designating signal for detecting designation of a predetermined particular operation mode to render active a mode detection signal. The operation confirmation circuit responds to an external control signal for detecting request of confirmation of an operation mode to render active an operation mode confirmation signal. The output buffer circuit receives the data read out by the memory cell selection circuit and the mode detection signal to output either thereof according to an output control signal and an operation mode confirmation signal.

Therefore, the main advantage of the present invention is that the output buffer circuit is controlled independently by an output control signal and an operation mode confirmation signal to output either a corresponding stored data or a mode detection signal. More specifically, by monitoring the output of the output buffer circuit responding to an external control signal, determination can be made whether the semiconductor memory device is in a test mode operation or not.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
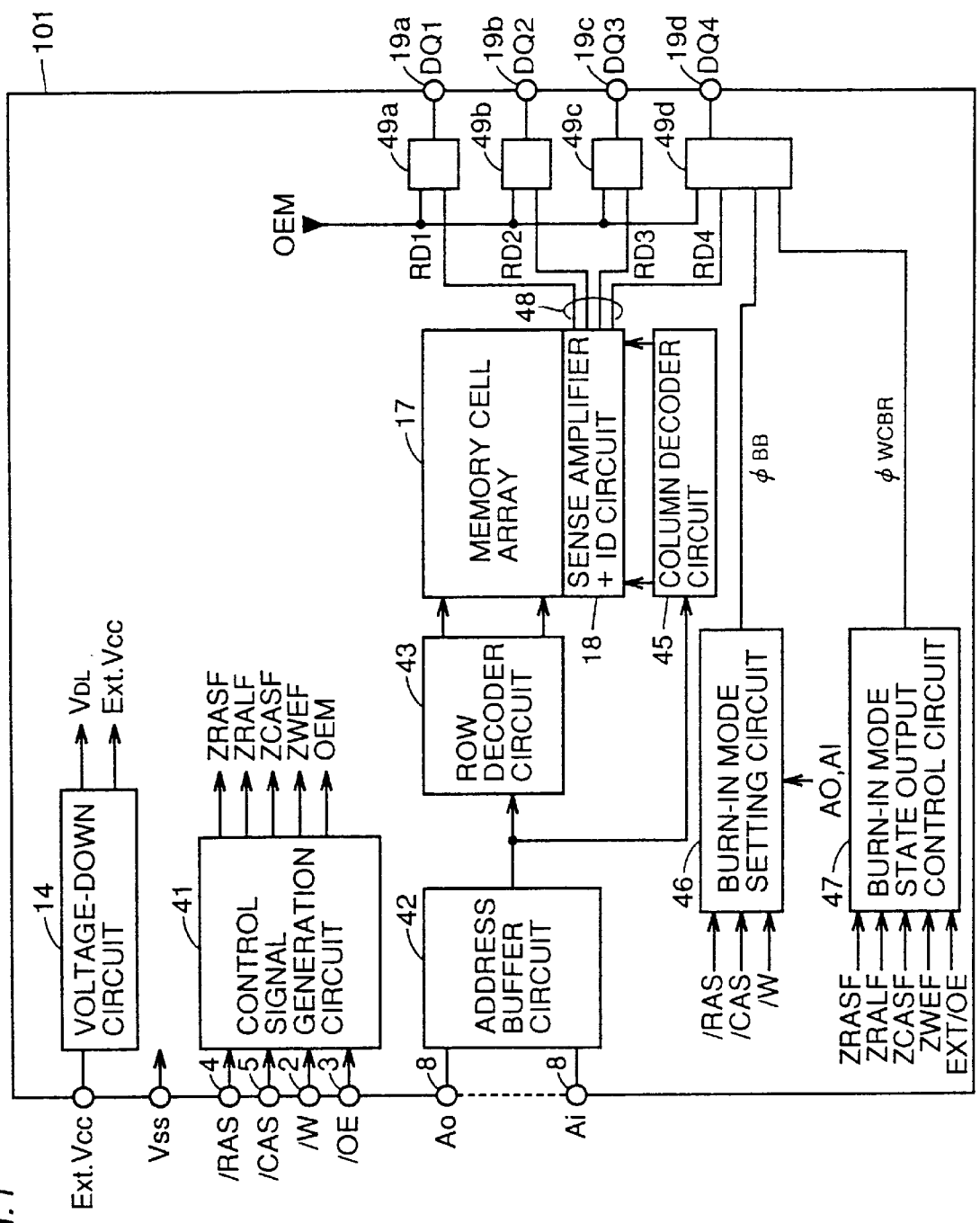
FIG. 1 is a block diagram schematically showing a structure of a semiconductor memory device according to a first embodiment of the present invention.

Referring to FIG. 1, a semiconductor memory device 101 according to the first embodiment includes a control signal generation circuit 41 receiving external control signals /W, /OE, /RAS, and /CAS applied via external control signal input terminals (node) 2–5 for generating an internal control signal, a memory cell array 17 in which memory cells are arranged in a matrix, an address buffer circuit 42 for receiving external address signals A0–Ai applied via an address signal input terminal (node) 8 for generating an internal row address signal and an internal column address under the control of control signal generation circuit 41, and a row decoder circuit 43 activated under the control of control signal generation circuit 41 for decoding an internal row address signal applied from address buffer circuit 42 to select a row (word line) in memory cell array 17.

Signal /W applied to external control signal input terminal (node) 2 is a write enable signal designating data writing. Signal /OE applied to external control signal input terminal (node) 3 is an output enable signal designating data output. Signal /RAS applied to external control signal input terminal (node) 4 is a row address strobe signal for initiating an internal operation in the semiconductor memory device and determining the active period of the internal operation. During activation of signal /RAS, circuitry related to operation of selecting a row in memory cell array 17 such as row decoder circuit 43 is rendered active. Signal /CAS applied to external control signal input terminal (node) 5 is a column address strobe signal to render active the circuit selecting a column in memory cell array 17.

Control signal generation circuit 41 responds to external row strobe signal /RAS to have the values of internal row strobe signal ZRASF and external row strobe signal /RAS held in a latch circuit (not shown), and then providing a latch internal row strobe signal ZRALF that shows a transition with a constant delay time behind internal row strobe signal ZRASF. Control signal generation circuit 41 responds to external column strobe signal /CAS and external write enable signal /W to provide internal row strobe signal ZCASF and internal write enable signal ZWEF, respectively.

Semiconductor memory device 101 further includes a column decoder circuit 45 activated under control of control signal generation circuit 41 for decoding an internal column address signal from address buffer circuit 42 to generate a column select signal to select a column in memory cell array 17, a sense amplifier for sensing and amplifying data of a memory cell connected to a selected row in memory cell array 17, an IO gate responsive to a column select signal from column decoder circuit 45 to connect a selected column of memory cell array 17 to an internal data bus 48, and output buffer circuits 49a–49d for generating external readout data DQ0–DQj from an internal readout data read out to internal data bus 48 during data readout under the control of control signal generation circuit 41. In FIG. 1, the sense amplifier and the IO gate are illustrated as one block 18. Output buffer circuits 49a–49d are rendered active in response to activation (transition to an H (logical high) level) of internal output enable signal OEM generated by control signal generation circuit 41 in response to output enable signal /OE.

Semiconductor memory device 101 further includes a burn-in setting circuit 46 for receiving external control signals /W, /OE, /RAS, /CAS and particular external signals, such as A0 and A1, out of external address signals A0–Ai to detect designation of a burn-in mode to render a burn-in detection signal $\phi_{BB}$ active (L (logical low) level), and a burn-in mode state output control circuit 47 receiving external control signals /W, /RAS, /CAS and /OE and responsive to transition of signals ZRASF, ZRALF, ZCASF and ZWEF output from control signal generation circuit 41 and external control signal /OE (EXT./OE) to detect request of confirmation of an operation mode to render operation mode confirmation signal $\phi_{WCBR}$ active (L level).

Output buffer circuit 49d receives readout data RD4 from memory cell array 17 and burn-in mode detection signal $\phi_{BB}$ to carry out the following operation under control of internal output enable signal OEM and operation mode confirmation signal $\phi_{WCBR}$. More specifically, input/output terminal 19d is set to a high impedance state when internal output enable signal OEM and operation mode confirmation signal $\phi_{WCBR}$ are both inactive (signal OEM: L level; signal $\phi_{WCBR}$: H level). When internal output enable signal OEM attains an active state (H level) and operation mode confirmation signal $\phi_{WCBR}$ attains an inactive state (H level), readout signal RD4 from memory cell array 17 is provided to input/output terminal 17d. When internal output enable signal OEM attains an inactive state (L level) and operation mode confirmation signal $\phi_{WCBR}$ attains an active state (L level), burn-in mode detection signal $\phi_{BB}$ is provided to input/output terminal 19d.

Semiconductor memory device 101 further includes a voltage-down circuit 14 receiving external power supply voltage EXT.$V_{CC}$ and responsive to burn-in detection signal $\phi_{BB}$ to output a down-converted voltage $V_{DL}$ or external power supply voltage EXT.$V_{CC}$ as an internal power supply voltage int.$V_{CC}$. Voltage-down circuit 14 provides down-converted voltage $V_{DL}$ and external power supply voltage EXT.$V_{CC}$ when burn-in mode detection signal $\phi_{BB}$ attains an inactive state (L level) and an active state (L level), respectively.

Figure 2:
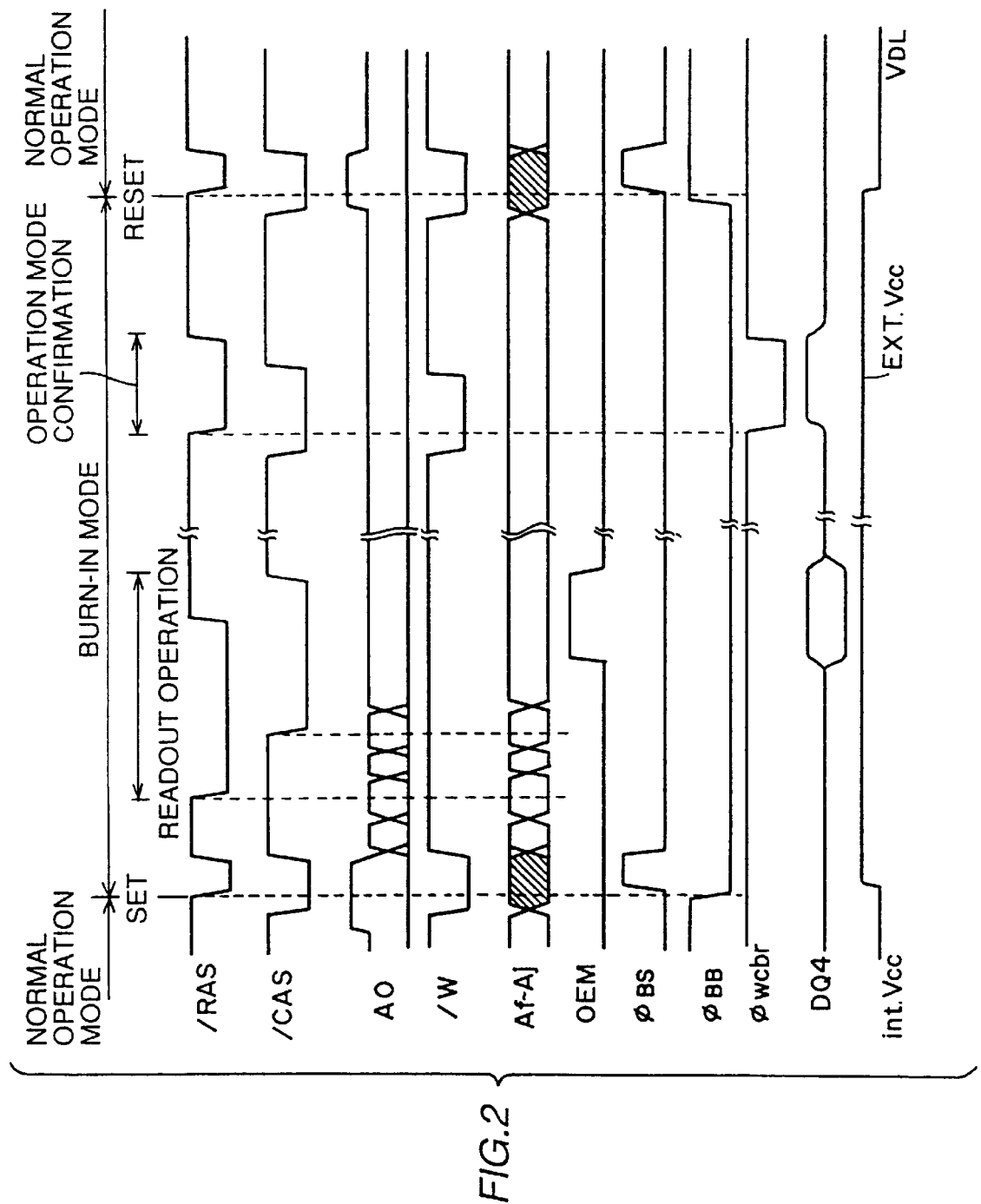
FIG. 2 is a timing chart of the operation of the first embodiment.

The operation of the semiconductor memory device 101 according to the present invention will be described with reference to the timing chart of FIG. 2.

The present invention is not limited to a burn-in testing and can be applied to other operation modes as a particular test mode designated by an external control signal.

A burn-in test operation mode includes three periods. A set operation period for setting a burn-in test, a burn-in test mode period in which burn-in testing is actually effected, and a reset operation period for resetting this burn-in test.

In a test operation, signals /CAS and /W are driven to an active state of an L level, and an external address signal, for example signal A0, is set to a voltage level sufficiently higher than the high level (VIH) applied at a normal operation mode, prior to a fall of external control signal /RAS (EXT./RAS). Also, an external address signal, for example signal A1, is set to an H level. More specifically, a burn-in test mode is set by satisfying at the same time the condition of the so-called "WCBR+super $V_{CC}$" and the condition that external address signal A1 attains an H level. When these conditions are met, burn-in setting circuit 46 provides an active burn-in mode detection signal $\phi_{BB}$ indicating designation of a burn-in mode to output buffer circuit 49d and voltage-down circuit 14.

Voltage-down circuit 14 responds to burn-in mode detection signal $\phi_{BB}$ to suppress the voltage-down operation and directly provides external power supply voltage EXT.$V_{CC}$. Semiconductor memory device 101 will operate at external power supply voltage EXT.$V_{CC}$ higher than the normal operation power supply voltage to execute accelerated testing.

In a burn-in test mode, a writing/reading cycle and the like are carried out on semiconductor memory device 101 to test whether operation failure occurs or not.

In order to externally detect whether semiconductor memory device 101 is set to a burn-in mode or not during a burn-in test mode, external control signals are driven so that signals /CAS and /W both attain an active state of an L level, i.e. to satisfy the "WCBR condition", prior to a fall of external control signal /RAS, for example. When burn-in mode state output control circuit 47 detects that this condition is met during a burn-in test mode, burn-in mode state output control circuit 47 provides an active operation mode confirmation signal $\phi_{WCBR}$ to output buffer circuit 49d. In response, output buffer circuit 49d provides a signal according to burn-in mode detection signal $\phi_{BB}$ to input/output terminal 19d.

Thus, confirmation can be made from the outside world whether burn-in mode setting circuit 46 properly detects designation of setting a burn-in mode with an active burn-in mode detection signal $\phi_{BB}$ (L level) or detection is not made properly with burn-in mode detection signal $\phi_{BB}$ remaining at an inactive state (H level) by monitoring the output of input/output terminal 19d.

At the end of a burn-in test mode, the WCBR+super $V_{CC}$ condition is specified again, and external address signal A1 is set to an L level. When burn-in mode setting circuit 46 detects satisfaction of this condition, burn-in mode setting circuit 46 provides an inactive burn-in mode detection signal $\phi_{BB}$ (H level) to output buffer circuit 49d and voltage-down circuit 14.

Voltage-down circuit 14 responds to burn-in mode detection signal $\phi_{BB}$ to initiate a voltage-down operation again, whereby a voltage $V_{DL}$ which is a down-converted version of external power supply voltage EXT.$V_{CC}$ to the circuitry in semiconductor memory device 101 as internal power supply voltage int.$V_{CC}$.

The present invention is not limited to the above-described structure in which confirmation of a burn-in mode setting is carried out by driving external control signals so as to satisfy the so-called "WCBR condition", and other combinations of the transition of the external control signals can be applied.

Figure 3:
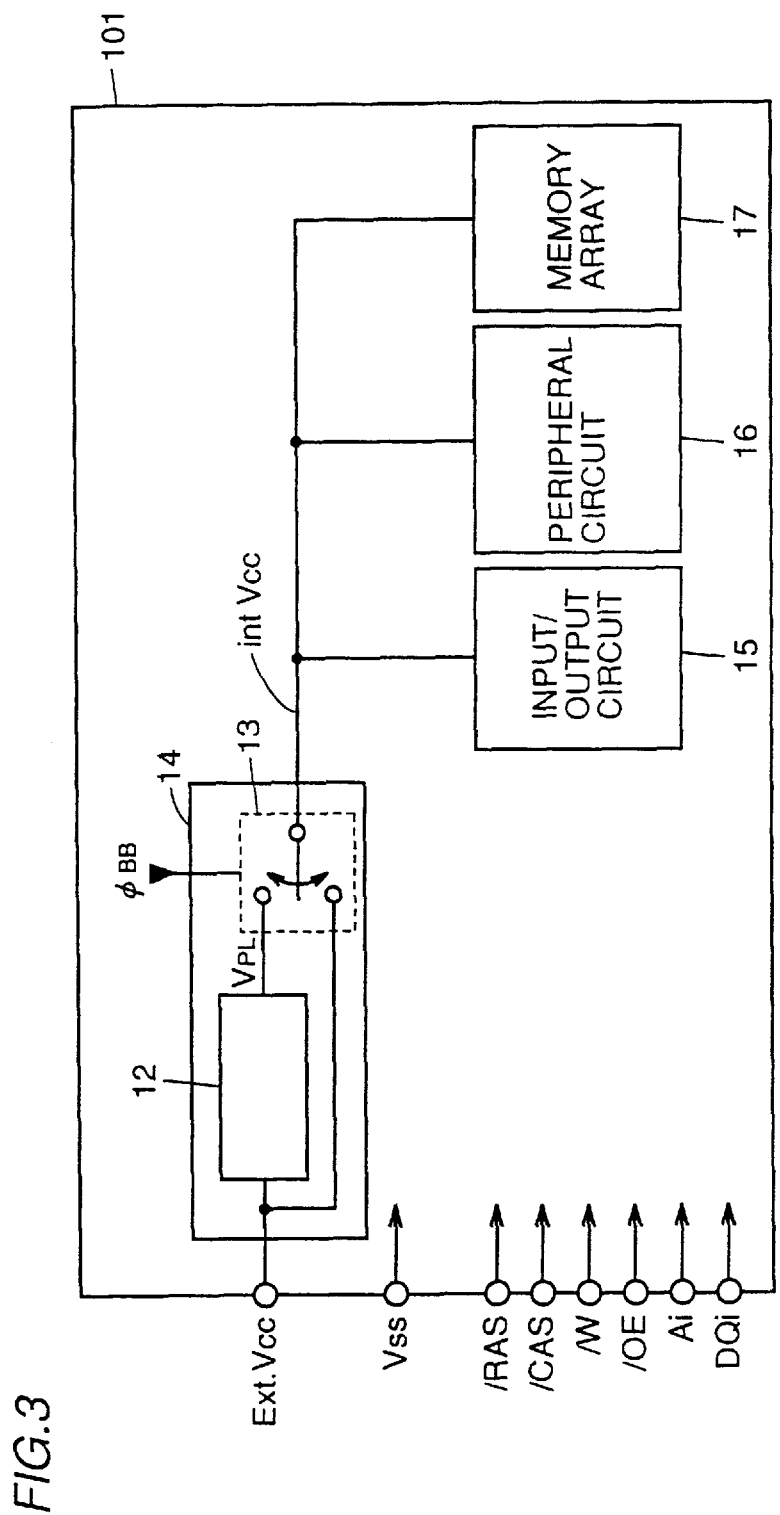
FIG. 3 is a block diagram schematically showing a structure of a voltage-down circuit of the first embodiment.

FIG. 3 is a block diagram showing the content of the operation of voltage-down circuit 14.

Referring to FIG. 3, a voltage conversion circuit 12 converts external power supply voltage EXT.$V_{CC}$ to $V_{DL}$ which is a down-converted power supply voltage. A switch circuit 13 responds to burn-in mode detection signal $\phi_{BB}$ to switch the output of voltage-down circuit 14 to the level of EXT.$V_{CC}$ in a burn-in mode and to $V_{DL}$ in a normal operation mode. Output int.$V_{CC}$ of voltage-down circuit 14 is applied to input/output circuit 15, peripheral circuit 16 and memory cell array 17.

Figure 4:
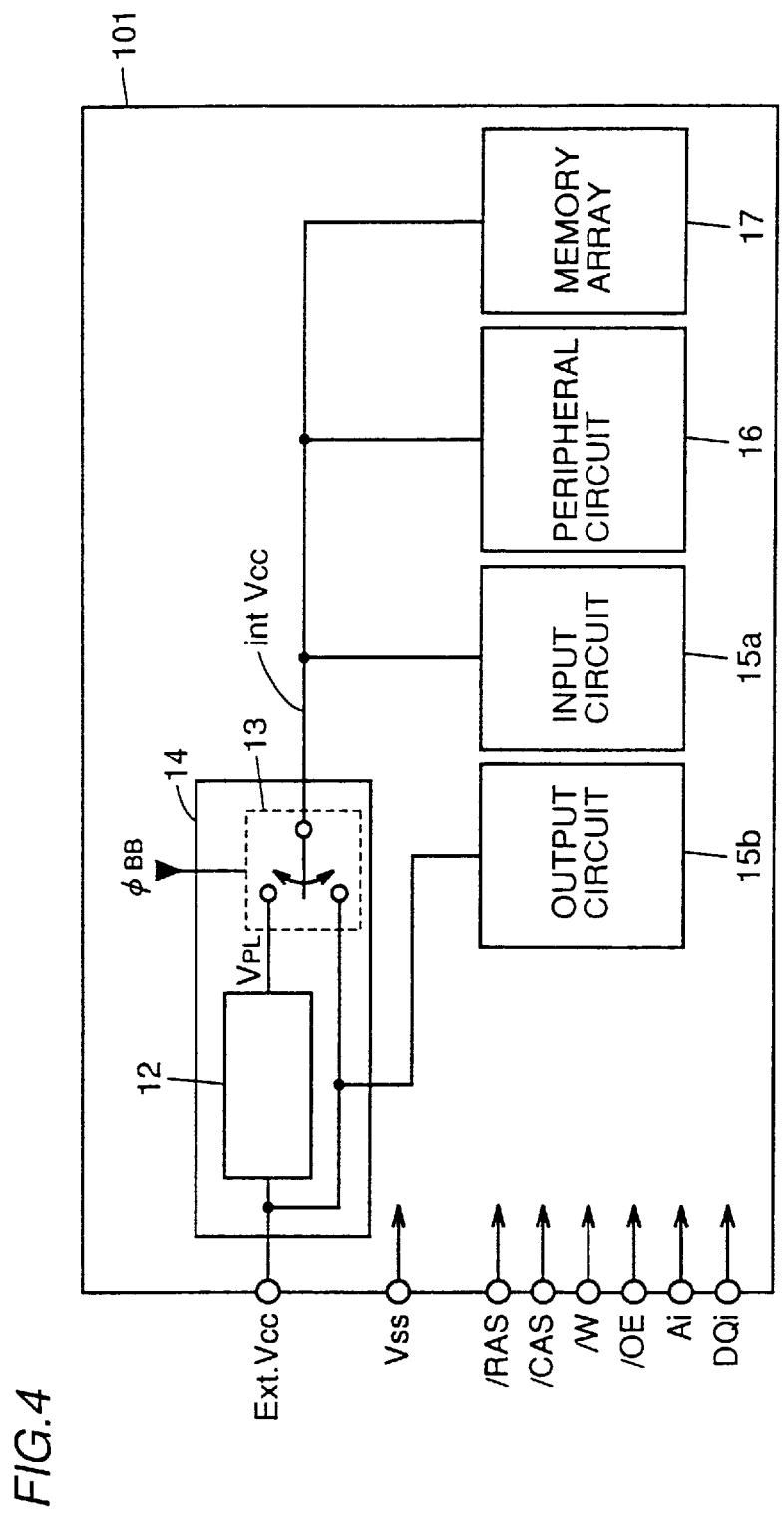
FIG. 4 is a modification of a voltage-down circuit of the first embodiment.

In FIG. 3 input/output circuit 15 is supplied with down-converted power supply voltage int.$V_{CC}$. This invention is not limited to the above case and can be applied, as shown in FIG. 4, to the case that input circuit 15a and output circuit 15b are supplied with int.$V_{CC}$ and external power supply voltage EXT.$V_{CC}$, respectively.

Figure 5:
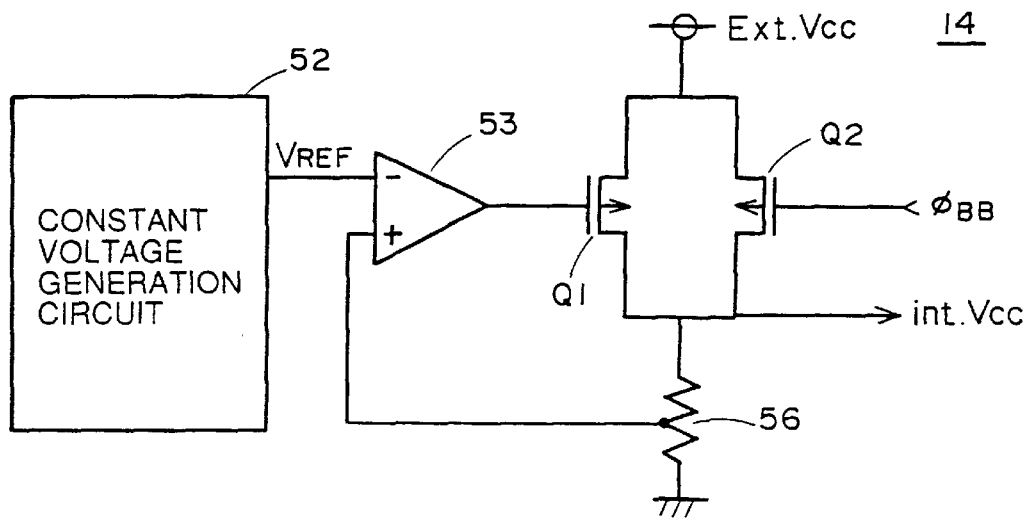
FIG. 5 is a circuit diagram showing a structure of the voltage-down circuit of the first embodiment.

FIG. 5 schematically shows an example of a structure of voltage-down circuit 14.

A constant voltage generation circuit 52 provides a constant voltage $V_{REF}$ corresponding to down-converted power supply voltage $V_{DL}$. P channel MOS transistors Q1 and Q2 have their sources both connected to external power supply voltage EXT.$V_{CC}$, and their drains both connected to one end of a resistor 56. The other end of resistor 56 is connected to ground $V_{SS}$. The potential at the node between the drains of p channel MOS transistors Q1 and Q2 and resistor 56 is output as internal power supply voltage int.$V_{CC}$. A differential amplifier 53 receives reference potential $V_{REF}$ and a voltage having down-converted power supply voltage $V_{DL}$ divided by resistor 56 to control the gate potential of P channel MOS transistor Q1 according to the output signal thereof. Therefore, the current flowing through P channel MOS transistor Q1 is controlled by the negative feedback from differential amplifier 53, whereby down-converted voltage $V_{DL}$ which is the potential of the node maintains a constant value when transistor Q2 is cut off.

The gate potential of P channel MOS transistor Q2 is controlled by burn-in mode detection signal $\phi_{BB}$ to be rendered non-conductive when burn-in mode detection signal $\phi_{BB}$ attains an inactive state (H level) to provide down-converted voltage $V_{DL}$ as output int.$V_{CC}$ of voltage down-circuit 14. When burn-in mode detection signal $\phi_{BB}$ attains an active state (L level), P channel MOS transistor Q2 is rendered conductive, whereby voltage-down circuit 14 provides external power supply voltage EXT.$V_{CC}$ as internal power supply voltage int.$V_{CC}$.

Figure 6A:
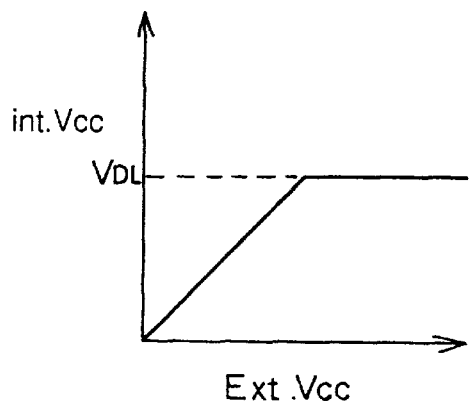
FIGS. 6A and 6B are diagrams to describe the operation of a voltage-down circuit in a normal operation and a burn-in mode operation, respectively.
Figure 6B:
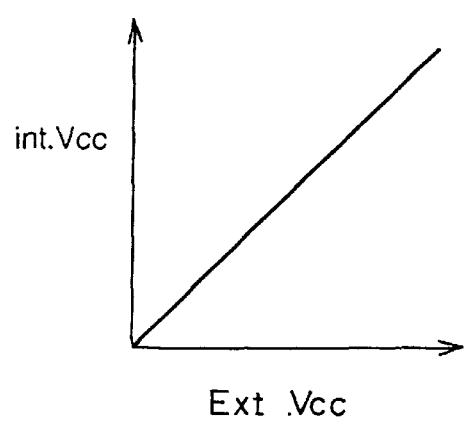

FIGS. 6A and 6B are graphs showing a relationship between external power supply voltage EXT.$V_{CC}$ and internal power supply voltage int.$V_{CC}$ according to a normal operation mode and a burn-in mode, respectively.

Referring to FIG. 6A, internal power supply voltage int.$V_{CC}$ applied to input/output circuit 15 and the like is fixed to a constant value of $V_{DL}$ in the region where external power supply voltage EXT.$V_{CC}$ exceeds a constant value in a normal operation mode. Voltage conversion circuit 12 is designed so that internal power supply voltage int.$V_{CC}$ =3.3 V (=$V_{DL}$) when external power supply potential EXT.$V_{CC}$ =5 V.

In a burn-in mode of FIG. 6B, internal power supply voltage int.$V_{CC}$ is equal to external power supply voltage EXT.$V_{CC}$. In general, screening by accelerated testing is carried out by applying a voltage of int.$V_{CC}$ =4.5 V or above to memory cell array 17 in a burn-in mode.

Figure 7:
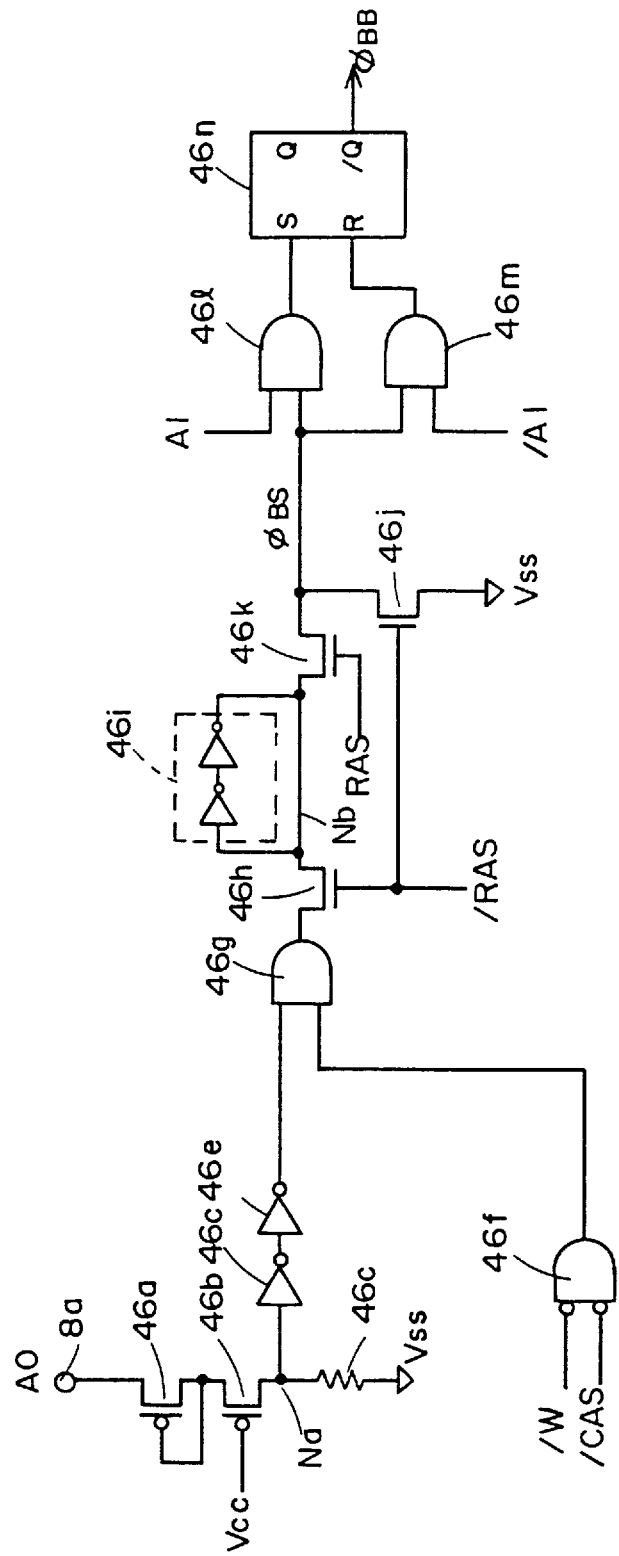
FIG. 7 is a circuit diagram showing a structure of a burn-in mode setting circuit according to the first embodiment.

FIG. 7 specifically shows burn-in mode setting circuit 46 of FIG. 1. Referring to FIG. 7, burn-in setting circuit 46 includes P channel MOS transistors 46a and 46b connected in series between a terminal 8a to which address signal A0 is applied out of external address signal input terminal 8 and a node N$a$, and a resistor element 46c of high resistance connected between node N$a$ and ground node $V_{SS}$. MOS transistor 46a has its source connected to address input terminal 8a, and its gate and drain connected to each other. MOS transistor 46b has its source connected to the gate and drain of MOS transistor 46a, and its drain connected to node N$a$. The gate of MOS transistor 46b receives operating power supply voltage $V_{CC}$. It is assumed that MOS transistors 46a and 46b have a current driving capability of a sufficient level.

Burn-in mode setting circuit 46 further includes two stages of cascade-connected inverters 46d and 46e for amplifying a signal potential on node N$a$, a gate circuit 46f for receiving control signals /W and /CAS, a gate circuit 46g for receiving an output signal of inverter 46e and an output signal of gate circuit 46f, a transfer gate 34h responsive to control signal /RAS to transmit an output signal of gate circuit 46g to a node N$b$, a latch circuit 46i formed of two stages of inverters for latching a signal potential on node N$b$, a transfer gate 46j responsive to control signal /RAS to discharge a signal /$\phi_{BS}$ to the level of ground potential, and a transfer gate 46k responsive to signal RAS to provide the signal of node N$b$ as signal $\phi_{BS}$. Gate circuit 46f provides a signal of an H level when signals /W and /CAS both attain an L level. Gate circuit 46g provides a signal of an H level when the output signals of inverter circuit 46e and gate circuit 46f both attain an H level. Transfer gates 46h and 46j are formed of N channel MOS transistors to be rendered conductive when signal /RAS attains an H level. Transfer gate 34k is formed of an N channel MOS transistor, for example, to conduct when signal RAS attains an H level. Control signals /W, /CAS and /RAS may be output signals of a buffer circuit not shown, or may be signals provided to external control signal input terminal.

Burn-in mode setting circuit 46 further includes a gate circuit 46l for receiving external address signal A1 and signal $\phi_{BS}$, a gate circuit 46m for receiving signal /A1 which is an inverted version of external address signal A1 and signal $\phi_{BS}$, and an SR flipflop circuit 46n. Gate circuit 46l provides a signal of an H level when external address signal A1 and signal $\phi_{BS}$ both attain an H level. Gate circuit 46m provides a signal of an H level when signals /A1 and $\phi_{BS}$ both attain an H level. Therefore, the output signals of gate circuits 46l and 46m are complementary to each other corresponding to external address signal A1 when signal $\phi_{BS}$, attains an H level, and are both driven to an L level when signal $\phi_{BS}$ attains an L level.

SR flipflop circuit 46n receives an output of gate circuit 46l as a set signal, and an output signal of gate circuit 46m as a reset signal R. Signal /Q which is an inverted version of the output signal of flipflop circuit 46m is provided as burn-in mode detection signal $\phi_{BB}$.

Figure 8:
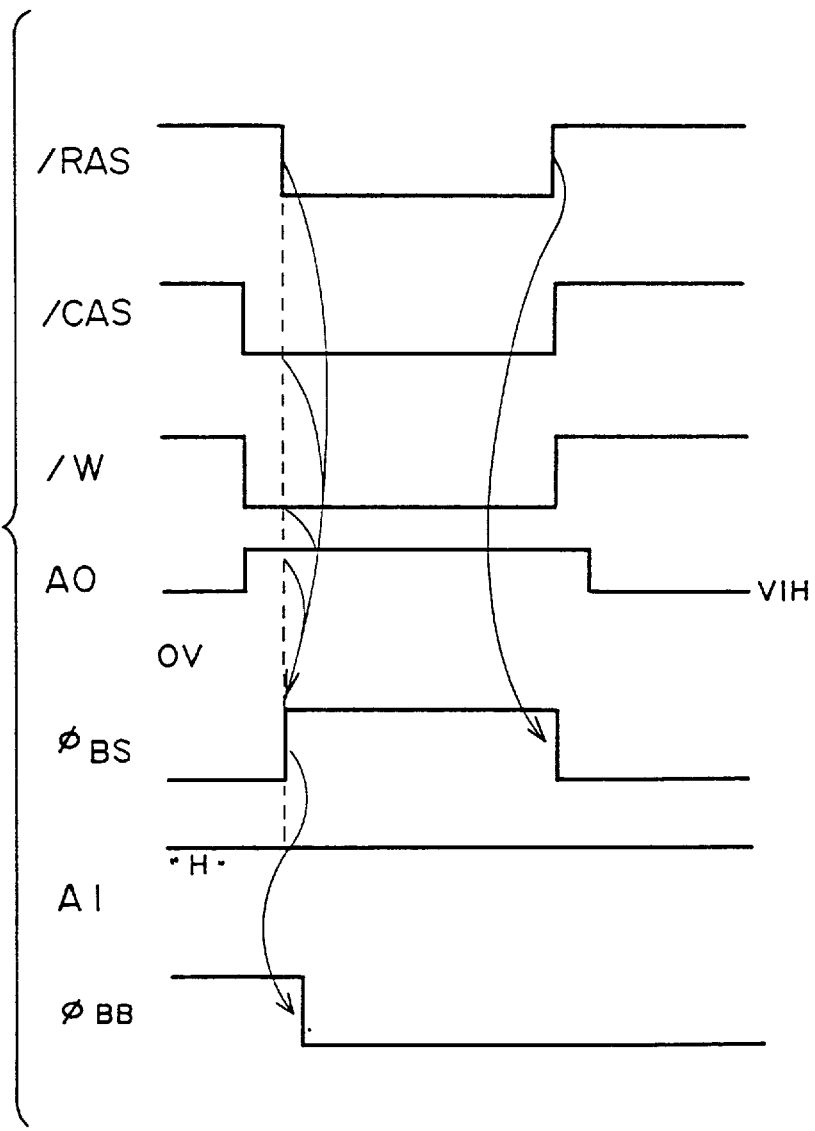
FIG. 8 is a timing chart showing an operation of the burn-in mode setting circuit.

The operation of burn-in mode setting circuit 46 of FIG. 7 will be described hereinafter with reference to the waveform diagram of FIG. 8.

In an operation mode (burn-in test operation and memory access operation) other than the operation related to set/reset corresponding to setting a burn-in test mode, external address signal A1 provided to external address input terminal 8a attains an L level or a high level (VIH) determined by a value of the specification. MOS transistor 46b conducts when the potential of the source thereof (node connected to transistor 46a) is greater than $V_{CC}+V_{thp}$. In conduction, MOS transistor 46a reduces the potential of the signal applied to external address input terminal 8a by a threshold voltage $V_{thp}$ and transmits the reduced potential to the source of MOS transistor 46b.

MOS transistors 46a and 46b both conduct when the level of the voltage applied to external address input terminal 8a exceeds $V_{CC}$ +2·$V_{thp}$. When the voltage level of external address signal A0 is lower than VIH which is the normal H level, MOS transistor 46b attains a non-conductive state. Therefore, no current flows in resistor 46c and node N$a$ is maintained at the level of ground potential. Therefore, independent of the logic level of the output signal of gate circuit 46f, the output signal of gate circuit 46g maintains an L level, and burn-in mode set designating signal $\phi_{BS}$ maintains an L level even when signal /RAS is toggled.

When the level of signal A0 applied to external address signal input terminal 8a is set to a predetermined condition, i.e. greater than ($V_{CC}$ +2·$V_{thp}$), transistors 46a and 46b conduct, whereby current flows to resistor 46c. The current driving capability of transistors 46a and 46b is great enough, and the ON resistance thereof is sufficiently smaller than the resistance of resistor element 46c. A small current flows to resistor element 46c and the potential of node N$a$ is pulled up to an H level ($V_{CC}$ level) to be amplified by inverter circuits 46d and 46e and provided to gate circuit 46g.

Since signals /W and /CAS both attain an L level, the output signal of gate circuit 46f is driven to an H level and the output signal of gate circuit 46g is driven to an H level. When signal /RAS attains an H level, transfer gate 46h conducts, whereby the output signal of gate circuit 46g is transmitted to node N$b$ and latched by latch circuit 46i.

Signal /RAS is complementary to signal RAS. In this state, transfer gate 46k attains a non-conductive state. Signal $\phi_{BS}$ is maintained at an L level since transfer gate 46j attains a conductive state.

When signal /RAS is pulled down to an L level, transfer gate 46h is rendered non-conductive, and the output portion of gate circuit 46g is cut off from node N$b$. Transfer gate 46j is also rendered non-conductive. Here, signal /RAS is pulled up to a high level to render transfer gate 46k conductive, whereby signal $\phi_{BS}$ is pulled up to an H level.

When external address signal A1 attains an H level, the output signal of gate circuit 46*l* is driven to an H level, and the output signal of gate circuit 46*m* is driven to an L level. Therefore, the output signal of SR flipflop circuit 46*n* is set, and signal /Q which is an inverted version of the output signal is pulled down to an L level. In other words, burn-in mode detection signal $\phi_{BB}$ is pulled down to an L level.

When signal /RAS is pulled up to an H level and an burn-in mode set operation is completed, transfer gate 46*h* is rendered conductive and transfer gate 46*k* is rendered non-conductive. As a result, transmission of the potential of the signal of node N*b* is inhibited. Transfer gate 46*j* is rendered conductive by signal /RAS, and burn-in mode set designating signal $\phi_{BS}$ is pulled down to an L level. Here, the outputs of gate circuits 46*l* and 46*m* are pulled down to an L level independent of the level of external address signal A1. Therefore, burn-in mode detection signal $\phi_{BB}$ provided from SR flipflop circuit 46*n* maintains its L level.

Since the condition of WCBR+super $V_{CC}$ is met similarly in a burn-in mode reset operation, signal $\phi_{BS}$ shows a transition according to control signal RAS. More specifically, when burn-in mode set designating signal $\phi_{BS}$ is pulled up to an H level while external address signal A1 is maintained at an L level, the output signal of gate circuit 46*m* is pulled up to an H level and the output signal of gate circuit 46*l* is pulled down to an L level since signal /A1 attains an H level. As a result, SR flipflop circuit 46*n* is reset. Burn-in mode detection signal $\phi_{BB}$ which is an inverted version of the output signal thereof shows a transition to an inactive state (H level).

A plurality of MOS transistors 46*a* for detecting the super $V_{CC}$ condition can be provided.

Figure 9:
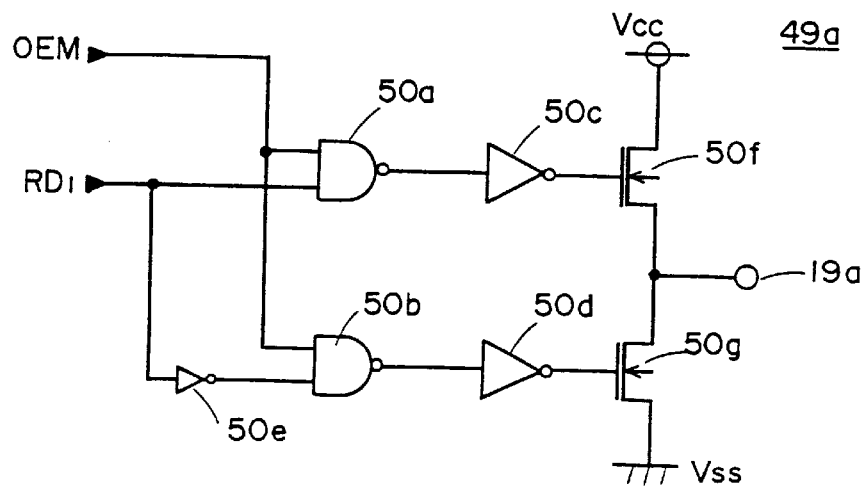
FIG. 9 is a circuit diagram showing a structure of a first output buffer circuit of the first embodiment.

FIG. 9 is a circuit diagram showing the structure of output buffer circuit 49*a* in semiconductor memory device 101 of FIG. 1. The structure of output buffer circuits 49*b* and 49*c* are the same.

Output buffer circuit 49*a* includes NAND gate circuits 50*a* and 50*b*, inverter circuits 50*c*, 50*d* and 50*e*, and N channel MOS transistors 50*f* and 50*g*.

N channel MOS transistors 50*f* and 50*g* are connected in series between power supply potential $V_{CC}$ and ground potential $V_{SS}$. A node N1 between transistors 50*f* and 50*g* is connected to external output terminal 19*a*.

NAND gate 50*a* receives internal output enable signal OEM and signal RD1 from data bus 48 at its input terminal. Inverter circuit 50*c* is connected between the output terminal of NAND gate 50*a* and the gate of transistor 50*f*.

NAND gate 50*b* receives signal OEM and a signal which is an inverted version of signal RD1 from data bus 48 by inverter circuit 50*e*. Inverter circuit 50*d* is connected between the output terminal of NAND gate 50*b* and the gate of transistor 50*b*.

Therefore, output buffer circuit 49*a* operates as set forth in the following.

When OEM attains an L level, transistors 50*f* and 50*g* are both turned off independent of the value of signal RD1. Therefore, external output terminal 19*a* attains an high impedance state.

When signal OEM attains an H level, readout data RD1 of an H level causes the outputs of NAND gate circuit 50*a* and inverter circuit 50*c* to be driven to an L level and an H level, respectively. In other words, N channel MOS transistor 50*f* is rendered conductive. The output of NAND gate circuit 50*b* attains an H level, and the output of inverter circuit 50*d* attains an L level. In other words, N channel MOS transistor 50*g* is cut off. Therefore, the potential of output terminal 19*a* attains an H level.

When readout data RD1 attains an L level, the level of each signal is opposite to that of the above-described signal level. N channel MOS transistor 50*f* is cut off, and N channel MOS transistor 50*g* is rendered conductive. Therefore, output terminal 19*a* attains an L level.

Figure 10:
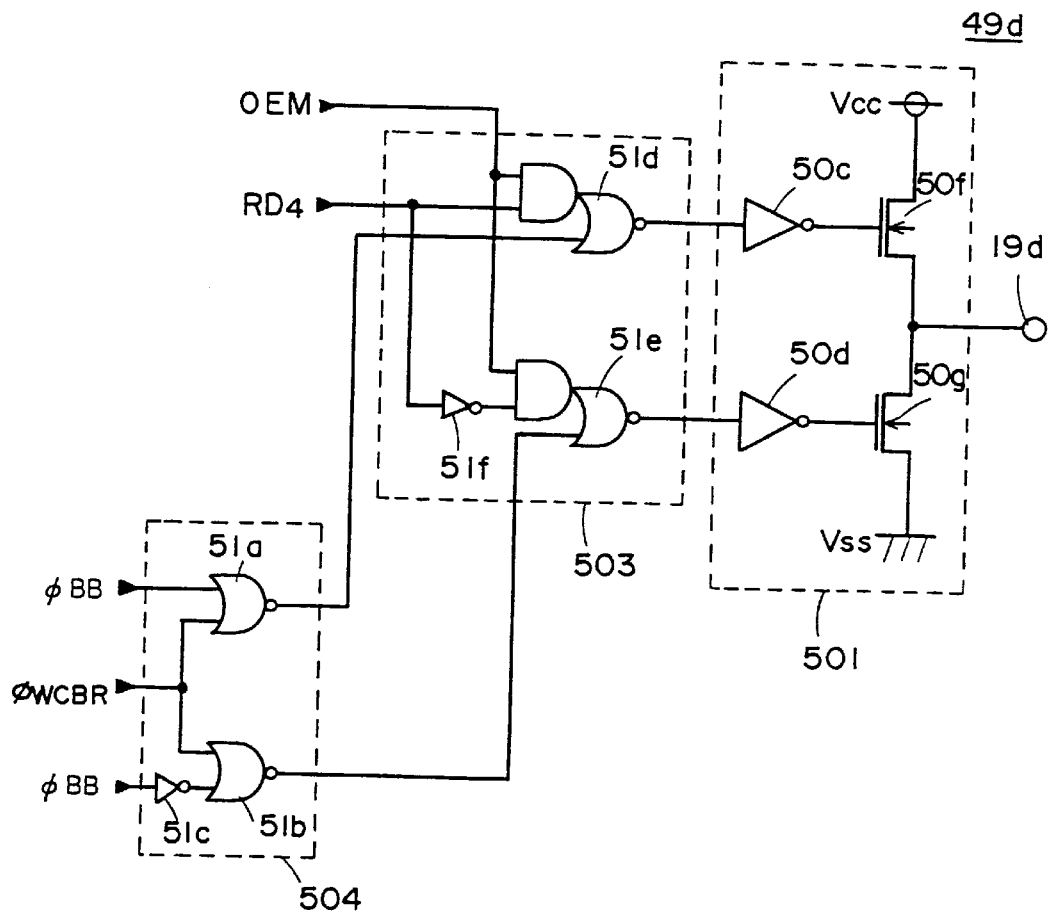
FIG. 10 is a circuit diagram showing a structure of a second output buffer circuit of the first embodiment.

FIG. 10 is a circuit diagram showing a structure of output buffer circuit 49*d*.

The structure of output buffer circuit 49*d* differs from the structure of output buffer circuits 49*a*–49*c* in that not only readout data RD4 from memory cell 17, but also a signal corresponding to a burn-in mode detection signal $\phi_{BB}$ can be selectively output.

More specifically, output buffer circuit 49*d* is formed mainly of an output drive circuit 501, a readout data output control circuit 503, and a burn-in mode detection signal output control circuit 504. Burn-in detection signal output control circuit 504 includes an NOR circuit 51*a* for receiving burn-in mode detection signal $\phi_{BB}$ and operation mode confirmation signal $\phi_{WCBR}$, an inverter circuit 51*c* for receiving burn-in mode detection signal $\phi_{BB}$, and an NOR circuit 51*b* receiving an output of inverter circuit 51*c* and operation mode confirmation signal $\phi_{WCBR}$.

Readout data output control circuit 503 includes a composite gate circuit 51*d* for receiving the logical product of internal output enable signal OEM and readout data RD4 and the output of NOR circuit 51*a* to provide an NOR signal, an inverter circuit 51*f* for receiving readout signal RD4, and a composite gate 5*ie* for receiving a logical product of the output of inverter circuit 51*f* and signal OEM and the output of NOR circuit 51*b* to output an NOR signal. Therefore, in composite gate circuits 51*d* and 51*e*, a signal according to burn-in mode detection signal $\phi_{BB}$ from burn-in mode detection signal output circuit 504 is applied to the first inputs, and readout signal RD4 and an inverted signal thereof are applied to the second inputs. In composite gate circuits 51*d* and 51*e*, the logical product of readout signal RD4 and an inverted signal thereof and internal output enable signal OEM are generated. The above-described logical product attains an L level irrespective to the value of signal RD4 or signals complementary to each other according to the value of signal RD4 in response to the value of signal OEM. The output of burn-in mode detection signal output control circuit 504 attains an L level irrespective of the value of burn-in mode detection signal $\phi_{BB}$ or a pair of signals complementary to each other according to signal $\phi_{BB}$ in response to operation mode confirmation signal $\phi_{WCBR}$. Therefore, composite gate circuits 51*d* and 51*e* selectively output a pair of signals that are complementary to each other which is either the signal pair corresponding to readout signal RD4 controlled by internal output enable signal OEM or the signal pair corresponding to burn-in mode detection signal $\phi_{BB}$ controlled by operation mode confirmation signal $\phi_{WCBR}$.

Output drive circuit 501 includes N channel MOS transistors 50*f* and 50*g* connected in series between power supply potential $V_{CC}$ and ground potential $V_{SS}$, an inverter circuit 50*c* connected between composite logic gate circuit 51*d* and the gate of N channel MOS transistor 50*f*, and an inverter circuit 50*d* connected between the output of composite gate circuit 51*e* and the gate of N channel MOS transistor 50*g*. The node of N channel MOS transistors 50*f* and 50*g* is connected to input/output terminal 19*d*.

The operation of output buffer circuit 49*d* will be described in further detail hereinafter.

First, the operation of output buffer circuit 49d in a normal operation mode will be described. In this case, operation mode confirmation signal $\phi_{WCBR}$ always attains an inactive state (H level). Therefore, the outputs of NOR circuits 51a and 51b both attain an L level irrespective of the level of burn-in mode detection signal $\phi_{BB}$. Therefore, the output of composite gate circuit 51d receiving the output of NOR circuit 51a as one input is the NOR value of the logical product of signals OEM and RD4, and the signal of an L level. Therefore, it is an inverted signal of the logical product of signal OEM and readout signal RD4. Similarly, the output of composite gate circuit 51e is an inverted signal of the logical product of signal OEM and an inverted signal of readout signal RD4.

When signal OEM attains an L level, the outputs of composite logic gate circuits 51d and 51e both attain an H level irrespective of the level of readout signal RD4. Since the inverted signals of the outputs of composite logic gates 51d and 51e are applied to the gates of N channel MOS transistors 50f and 50g, N channel MOS transistors 50f and 50g are both rendered non-conductive. More specifically, input/output terminal 19d attains an high impedance state.

When signal OEM and readout signal RD4 both attain an H level, the output signal of composite logic gate 51d attains an L level, whereby N channel MOS transistor 50f receiving an inverted signal thereof at its gate is rendered conductive. In contrast, the output signal of composite gate circuit 51e attains an H level, whereby N channel MOS transistor 50g signals receiving an inverted signal thereof at its gate is cut off. More specifically, the potential of input/output terminal 19d attains an H level.

When signal OEM attains an H level and readout signal RD4 attains an L level, N channel MOS transistor 50f is cut off and N channel MOS transistor 50g is rendered conductive, opposite to the above case. Therefore, input/output terminal 19 is set to an L level.

In a normal operation mode, output terminal 19d. attains a high impedance state and the potential of input/output terminal 19d attains a level according to a readout signal RD4, when signal OEM attains an L level and D an H level, respectively.

The operation of output buffer circuit 49d after transition of external control signals /RAS, /CAS and /W external address signal A0 to satisfy the aforementioned "WCBR+ super $V_{CC}$" condition will be described hereinafter. Here, signal OEM always attains an L level.

Figure 11:
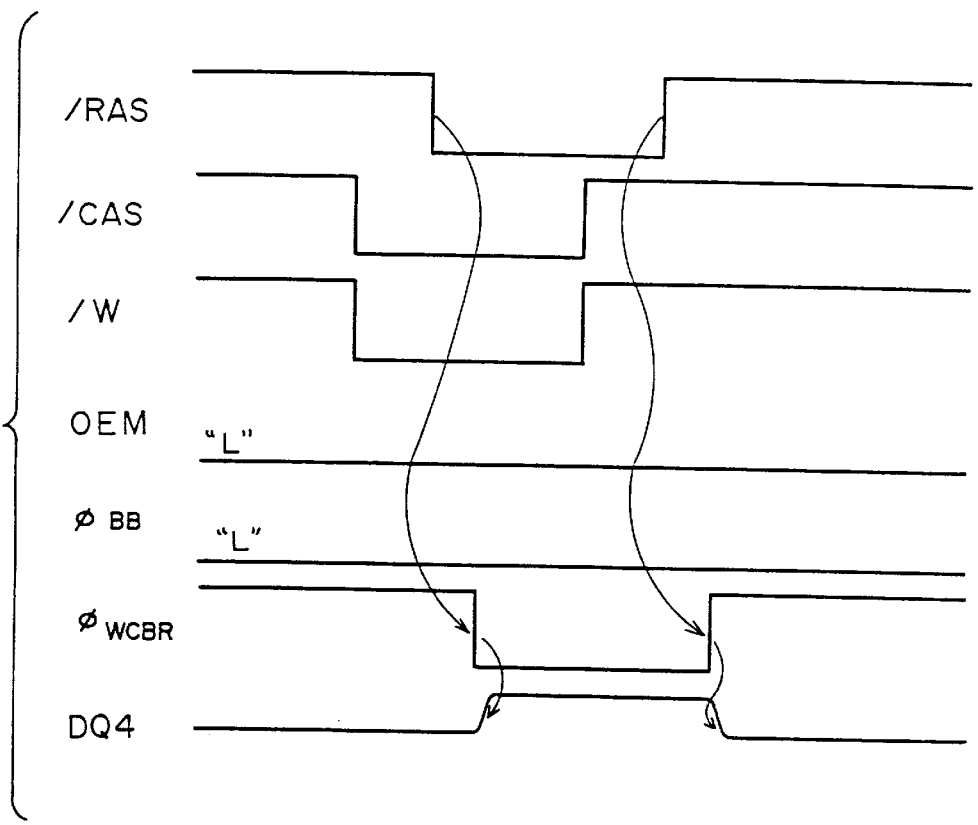
FIGS. 11 and 12 are first and second timing charts, respectively, of the operation of the second output buffer circuit.

When semiconductor memory device 101 is properly set to a burn-in test mode, burn-in mode detection signal $\phi_{BB}$ attains an active state (L level). FIG. 11 is a timing chart of such a state showing the operation of output buffer circuit 49d in confirming the operation mode of semiconductor memory device 101 from the outside world.

When external control signals /RAS, /CAS and /W are driven so as to satisfy the WCBR condition in order to confirm the operation mode of semiconductor memory device 101 externally, burn-in mode state output control circuit 47 detects a request of confirmation of the operation mode to render operation mode confirmation signal $\phi_{WCBR}$ to an active state (L level). Here, the output of NOR circuit 51a having input signals $\phi_{BB}$ and $\phi_{WCBR}$ both attaining an L level is pulled to an H level. In contrast, the output of NOR circuit 51b attains an L level with signal $\phi_{WCBR}$ of an L level at one input and an inverted signal of signal $\phi_{BB}$ of an H level at the other input.

Therefore, the output signal of composite gate circuit 51d receiving the output signal of NOR circuit 51a at one input attains an L level. N channel MOS transistor 50f receiving an inverted signal of the output of composite gate circuit 51d at its gate is rendered conductive.

In contrast, the output signal of composite gate circuit 51e receiving the output signal of NOR circuit 51b at one input is pulled up to an H level. N channel MOS transistor 50g receiving an inverted signal of this signal at its gate is rendered non-conductive. Therefore, input/output terminal 19d shows a transition from a high impedance state to an H level.

When confirmation of the operation mode of semiconductor memory device 101 is requested according to a combination of external control signals in a burn-in test mode, the potential of input/output terminal 19d attains an H level to allow confirmation of semiconductor memory device 101 attaining a burn-in test mode when burn-in mode detection signal $\phi_{BB}$ controlling a burn-in mode operation attains an active state.

Figure 12:
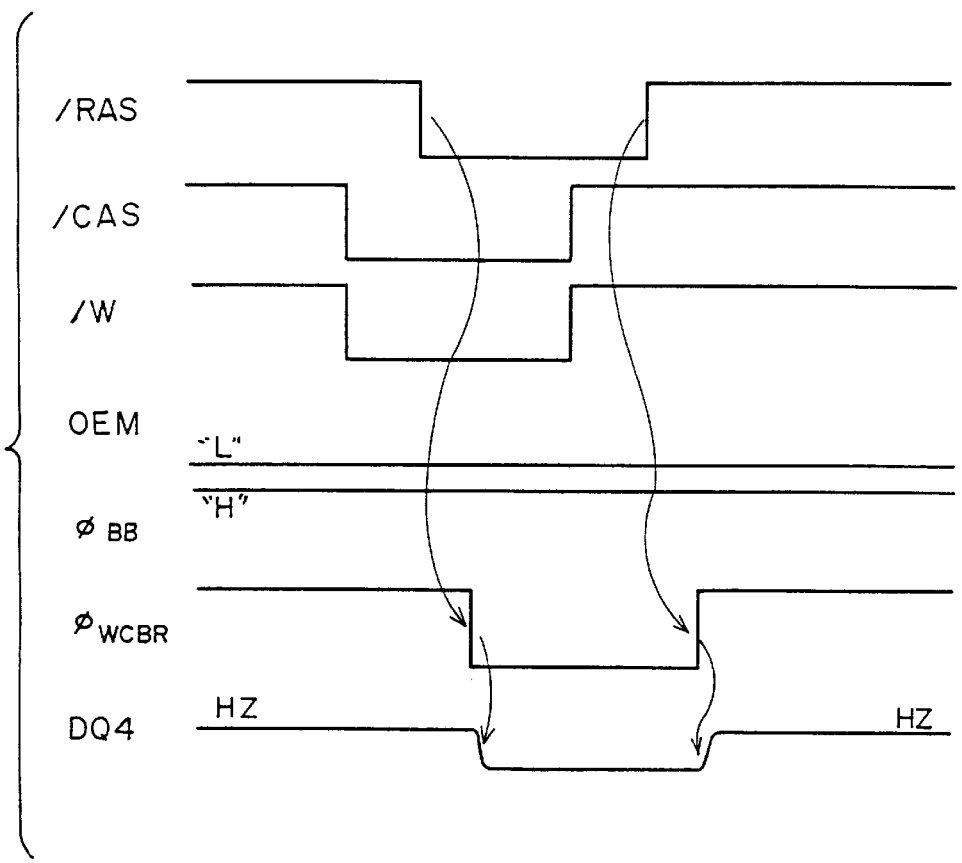

FIG. 12 is a timing chart showing an operation of output buffer circuit 49 with respect to an external request of confirming the operation mode when semiconductor memory device 101 is not properly set to a burn-in mode due to erroneous operation or the like in the case where external control signals /RAS, /CAS and /W and external address signal A0 are driven so as to satisfy the WCBR+super $V_{CC}$ condition.

In this case, burn-in mode detection signal $\phi_{BB}$ still attains an inactive state (H level). When external control signals /RAS, /CAS and /W are driven so as to satisfy the WCBR condition as a request for confirming the operation mode, operation mode confirmation signal $\phi_{WCBR}$ shows a transition to an L level. Since burn-in mode detection signal $\phi_{BB}$ attains an H level, the output of NOR gate circuit 51a is driven to an L level and the output of NOR gate circuit 51b is driven to an H level.

Therefore, the output signal of composite gate circuit 51d is pulled up to an H level. N channel MOS transistor 50f receiving an inverted signal thereof at its gate is cut off. In contrast, the output signal of composite gate circuit 51e is driven to an L level, and N channel MOS transistor 50g receiving an inverted signal thereof at its gate is rendered conductive. More specifically, input/output terminal 19d shows a transition from a high impedance state to an L level.

By driving external control signals /RAS, /CAS and /W and external address signal A0 so as to satisfy the WCBR+ super $V_{CC}$ condition, request of confirmation of the operation mode by a combination of the external control signals after completion of a burn-in mode set operation for semiconductor memory device 101 causes a potential transition according to the state of burn-in mode detection signal $\phi_{BB}$ on input/output terminal 19d.

Therefore, confirmation can easily be made whether each semiconductor memory device 101 is carrying out a burn-in test operation or not even in the case where a plurality of semiconductor memory devices 101 carry out a burn-in testing concurrently. More specifically, the time required for confirming the operation mode of each semiconductor memory device 101 can be reduced. Thus, the time required for testing can be reduced and the reliability of the burn-in testing improved.

Figure 13:
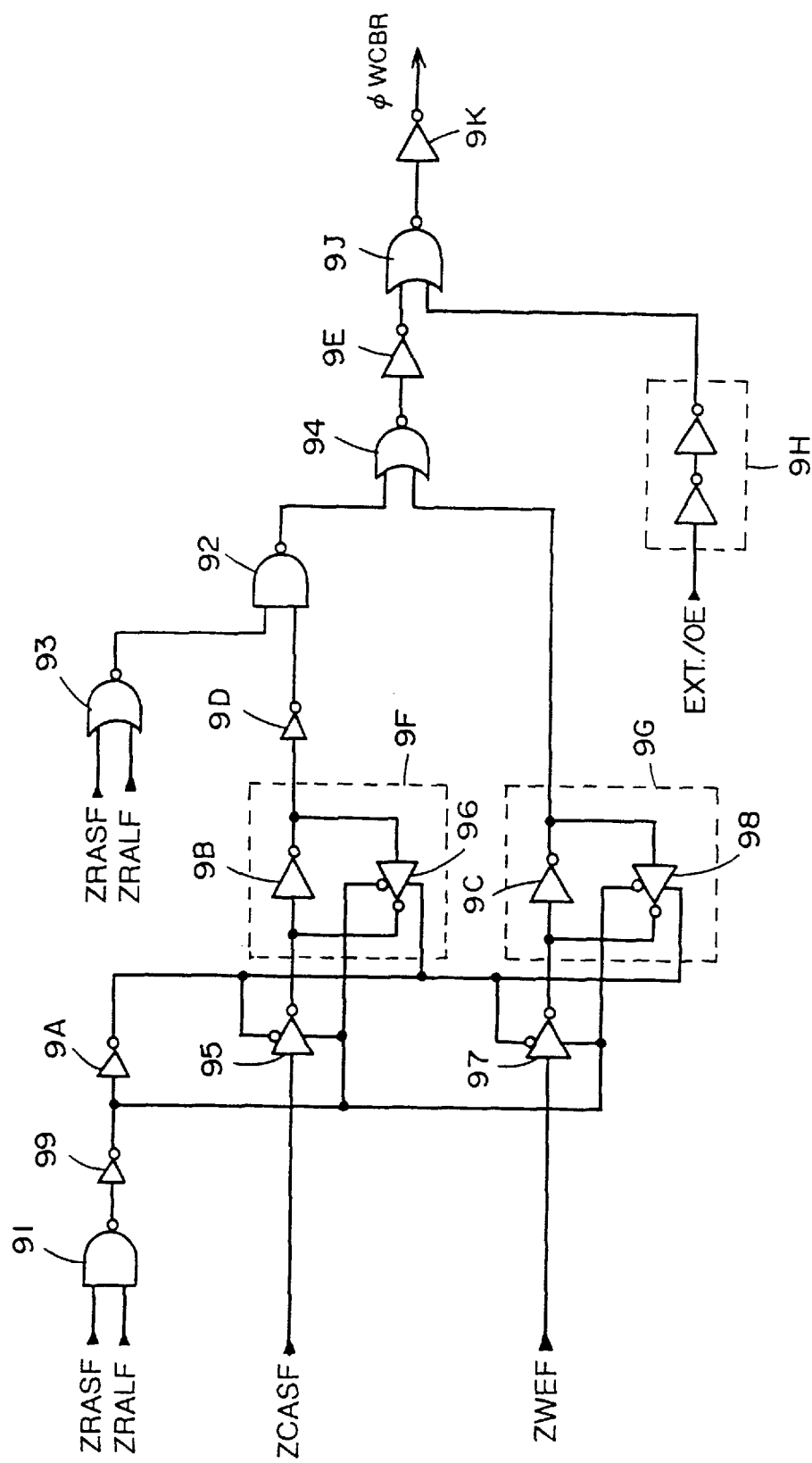
FIG. 13 is a circuit diagram showing a structure of a burn-in mode state output control circuit according to the first embodiment.

FIG. 13 shows a structure of a burn-in mode state output control circuit 47.

Referring to FIG. 13, burn-in mode state output control circuit 47 includes an NAND circuit 91 receiving external row address strobe signal /RAS for providing an output of an H level when either a ZRASF signal generated by control signal generation circuit 41 or a ZRALF signal showing a transition delayed for a constant time period from this signal attains an L level, an inverter circuit 99 for receiving an output of NAND circuit 91, an inverter circuit 9A for receiving an output of inverter circuit 99, a clocked inverter circuit 95 for receiving a ZCASF signal generated by control signal generation circuit 41 in response to external column address strobe signal /CAS and controlled by output signals of inverter circuits 99 and 9A to be rendered active when the outputs of inverter circuits 99 and 9A attain an L level and an H level, respectively, a latch circuit 9F formed of a clocked inverter 96 and an inverter circuit 9B controlled by output signals of inverter circuits 99 and 9A to be rendered active when the outputs of inverter circuits 99 and 9A attain an H level and an L level, respectively, an inverter circuit 9D for receiving the output of latch circuit 9F, an NOR circuit 93 for receiving signals ZRASF and ZRALF, an NAND circuit 92 for receiving outputs of NOR circuit 93 and inverter circuit 9D, a clocked inverter circuit 97 receiving signal ZWEF generated by control signal generation circuit 41 in response to external write enable signal /W, and controlled by output signals of inverter circuits 99 and 9A to be rendered active when outputs of inverter circuits 99 and 9A attain an L level and an H level, respectively, a latch circuit 9G formed of a clocked inverter circuit 98 and an inverter circuit 9C controlled by the output signals of inverter circuits 99 and 9A to be rendered active when the outputs of inverter circuits 99 and 9A attain an H level and an L level, respectively, an NOR circuit 94 for receiving an output of latch circuit 9G and an output of NAND circuit 92, an inverter circuit 9E for receiving an output of NOR circuit 94, a buffer circuit 9H for receiving external output enable signal EXT.OE, an NOR circuit 9J for receiving an output of buffer circuit 9H and an output of inverter circuit 9E, and an inverter circuit 9K for receiving an output of NOR circuit 9J to output operation mode confirmation signal $\phi_{WCBR}$.

Figure 14:
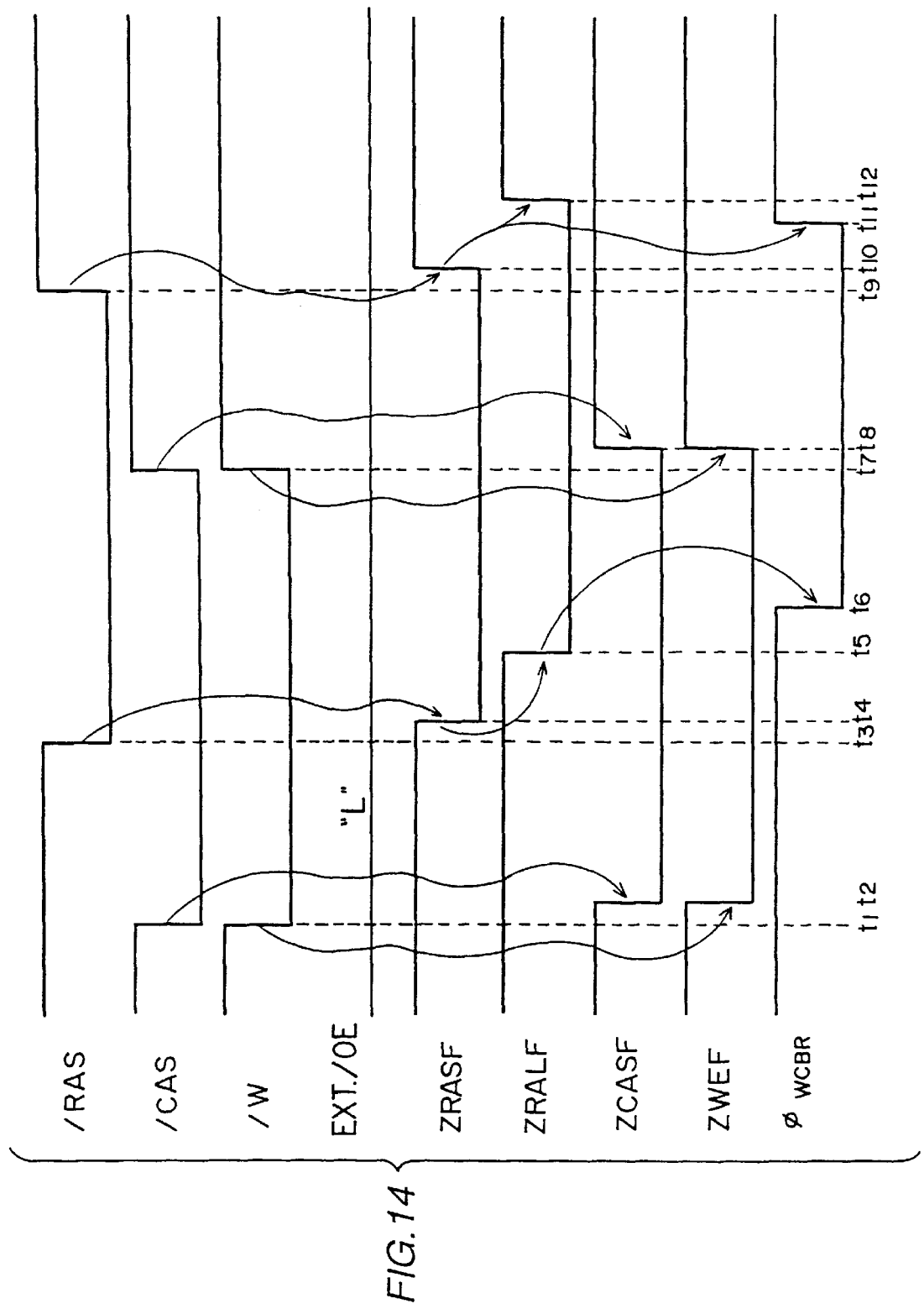
FIG. 14 is a timing chart showing an operation of the burn-in mode state output control circuit.

The operation of burn-in mode state output control circuit 47 will be described hereinafter with reference to the timing chart of FIG. 14.

In the following, it is assumed that external output enable signal EXT.OE attains an active state (L level). In response to the transition of external control signals /CAS and /W to an L level from an active state of an H level at time t1, control signal generation circuit 41 drives internal column strobe signal ZCASF and internal write enable signal ZWEF to an L level at time t2. Since signals ZRASF and ZRALF both attain an H level, the output of NAND circuit 91 attains an L level, and the outputs of inverter circuits 99 and 9A attain an H level and an L level, respectively. Therefore, clocked inverters 95 and 97 are rendered active to provide inverted signals of signals ZCASF and ZWEF.

In response to external row strobe signal RAS showing a transition to an L level from an H level at time t3, control signal generation circuit 41 drives internal row strobe signal ZRASF to an L level at time t4. Here, the output signal of NAND circuit 91 is driven to an H level, and the outputs of inverter circuits 99 and 9A are driven to an L level and an H level, respectively. As a result, latch circuits 9F and 9G are opened to respectively hold the output signals of clocked inverter circuits 95 and 97. Latch circuits 9F and 9G both output a signal of an L level until the state thereof is reset.

Inverter circuit 9D receives an output of latch circuit 9F to output a signal of an H level. In a period from time t4 to time t5, internal row strobe signal ZRAS attains an L level, and internal latch row strobe signal ZRALF attains an H level. Therefore, the output of NOR gate circuit 93 attains an L level. In response, the output of NAND circuit 92 receiving the outputs of NOR gate circuit and inverter circuit 9D attains an L level. The output of NOR gate circuit 94 receiving the outputs of NAND circuit 92 and latch circuit 9G attains an L level. The output signal of inverter circuit 9E receiving the output of NOR gate circuit 94 attains an H level. Therefore, the output of NOR gate circuit 9J receiving an L level at one input and an H level at the other input attains an L level. Operation mode confirmation signal $\phi_{WCBR}$ which is an output signal of inverter circuit 9K attains an H level.

When internal latch row strobe signal ZRALF shows a transition from an H level to an L level at time t5, the output of NOR circuit 93 is driven to an H level. Therefore, the output signal of NAND circuit 92 is pulled down to an L level. In response, the output of NOR gate circuit 94 is pulled up to an H level. In response to the output signal of inverter circuit 9E receiving the output of NOR circuit 94 attaining an L level at time t6, signal $\phi_{WCBR}$ is pulled down to an L level.

By transition of external control signals /RAS, /CAS and /W so as to satisfy the so-called WCBR condition, operation mode confirmation signal $\phi_{WCBR}$ is pulled down to an L level from an H level.

In response to the transition of external row strobe signal /RAS to an H level from an L level at time t9, control signal generation circuit 41 drives internal row strobe signal ZRASF to an H level from an L level at time t10. Here, the output of NOR gate circuit 93 receiving signals ZRASF and ZRALF is driven to an L level. Therefore, the output of NAND circuit 92 receiving the output of NOR gate circuit 93 at one input is driven to an H level irrespective of the level of the signal of inverter circuit 9D which is the other input. The output of NOR gate circuit 94 receiving the output of NAND gate circuit 92 at one input attains an L level irrespective of the level of the output signal of latch circuit 9G received at the other input. Therefore, operation mode confirmation signal $\phi_{WCBR}$ which is an inverted version of the output signal of NOR gate circuit 9J receiving an inverted signal and a signal of an L level shows a transition to an H level at time t11.

As described above, in the case where external output enable signal EXT.OE attains an L level, burn-in mode state output control circuit 47 causes a transition of output signal $\phi_{WCBR}$ to an active state (L level) when external control signals /RAS, /CAS and /W satisfy the so-called WCBR condition.

When external output enable signal EXT.OE attains an inactive state (H level), output signal $\phi_{WCBR}$ of burn-in mode state output control circuit 47 constantly maintains an inactive state (H level).

Thus, in testing a plurality of semiconductor memory devices 101 concurrently, the semiconductor memory device specified by an external output enable signal EXT.OE provides a signal according to burn-in mode detection signal $\phi_{BB}$ to input/output terminal 19d.

The present invention is not limited to the above-described structure in which the external control signals are driven so as to satisfy the WCBR condition in order to render operation mode confirmation signal $\phi_{WCBR}$ active, and a combination of other external control signals can be used.

According to the above structure, the potential level of input/output terminal 19d can be driven in response to the potential level of burn-in mode detection signal $\phi_{BB}$ by rendering operation mode confirmation signal $\phi_{WCBR}$ active according to a combination of external control signals in a burn-in mode. In other words, confirmation of whether semiconductor memory device 101 is set to a burn-in mode or not can be made by monitoring the potential level of input/output terminal 19d.

Second Embodiment

Figure 15:
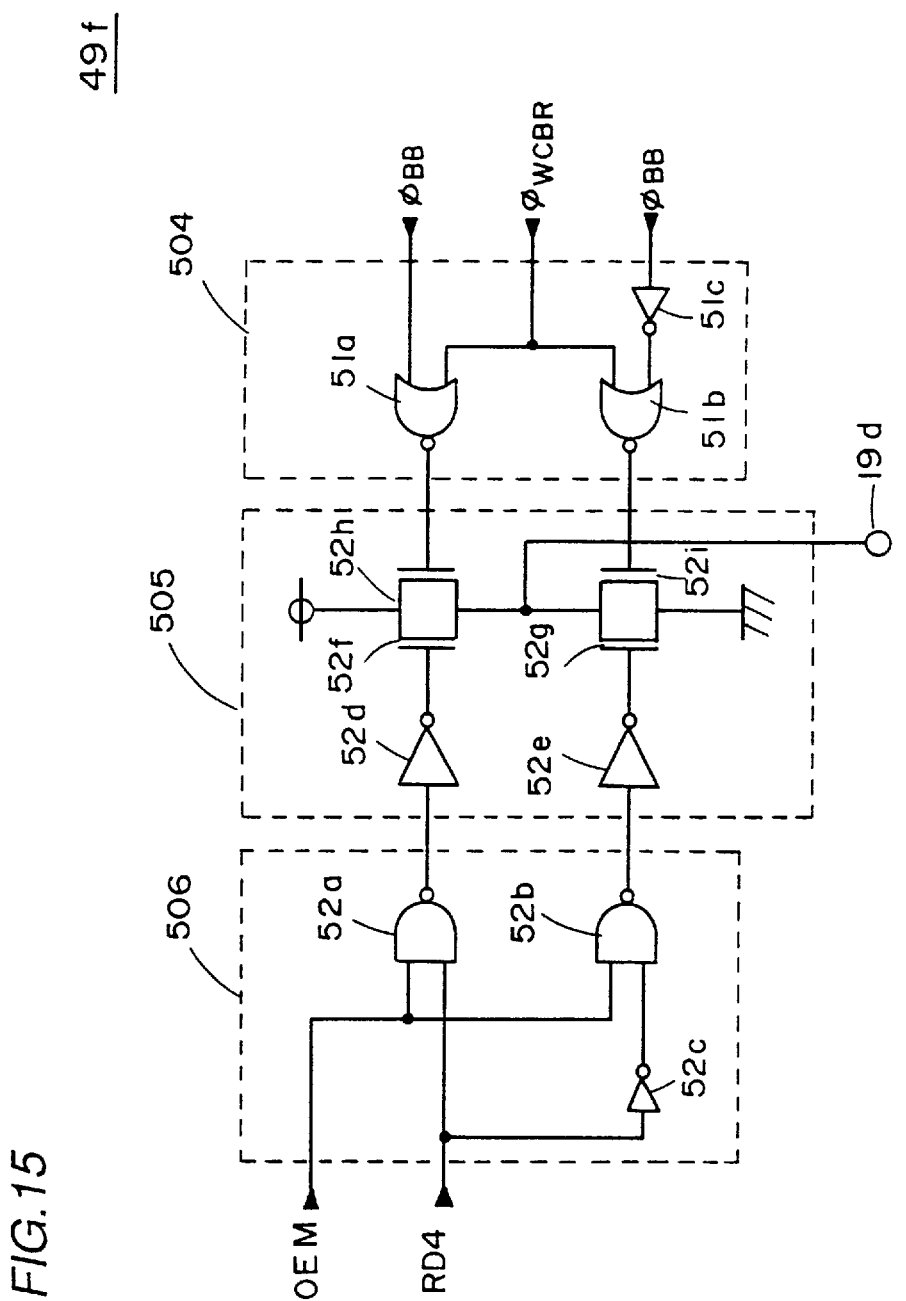
FIG. 15 is a circuit diagram showing a structure of an output buffer circuit according to a second embodiment of the present invention.

FIG. 15 is a circuit diagram showing a structure of an output buffer circuit 49f for providing a signal to input/output terminal 19d in a semiconductor memory device 101 according to a second embodiment of the present invention. The remaining elements are similar to those of semiconductor memory device 101 of the first embodiment, and their description will not be repeated.

Output buffer circuit 49f of the second embodiment differs from output buffer circuit 49d of the first embodiment in the following two points.

First, in readout data output control circuit 506, NAND circuit 52a receives signal OEM and readout data signal RD4, and NAND circuit 52b receives signal OEM and an inverted version of readout data signal RD4 by inverter circuit 52c.

Secondly, in output drive circuit 505, another pair of N channel MOS transistors 52h and 52i controlled according to an output signal from burn-in mode detection signal output control circuit 504 is provided in parallel to the pair of N channel MOS transistors 50f and 50g controlled according to an output signal from read out data output control circuit 506. Here, the gate width of the pair of N channel MOS transistors 52h and 52i is set smaller than the gate width of the other pair of N channel MOS transistors 52f and 52g.

In output buffer circuit 49d of the first embodiment, output drive circuit 501 is controlled according to an output signal from read data output control circuit 503 in a normal operation, and controlled according to an output signal from burn-in mode detection signal output control circuit 504 in a burn-in mode. It was therefore necessary to use composite gate circuits 51d and 51e in order to provide a structure in which output drive circuit 501 is commonly shared with the output of readout data and the output of a burn-in mode detection signal. Such a structure had the disadvantage that the speed of reading out stored data from memory cell 17 in a normal operation mode is deteriorated since the operation rate of a CMOS gate circuit is degraded according to increase in the number of input signals.

In the second embodiment of the present invention, the pair of N channel MOS transistors 52f and 52g for controlling the potential of input/output terminal 19d according to readout data in a normal operation mode is provided in addition to the pair of N channel MOS transistors 52h and 52i for controlling the potential of input/output terminal 19d in response to a burn-in mode detection signal in a burn-in mode to solve the above-described problem.

More specifically, output buffer circuit 49f is formed mainly of a burn-in mode detection signal output control circuit 504, an output drive circuit 505, and a read data output control circuit 506.

Burn-in mode detection signal output control circuit 504 includes an NOR gate circuit 51a for receiving a burn-in mode detection signal $\phi_{BB}$ and an operation mode confirmation signal $\phi_{WCBR}$ an inverter circuit 51c for receiving signal $\phi_{BB}$, and an NOR gate circuit 51b for receiving an output signal of inverter circuit 51c and signal $\phi_{WCBR}$.

Readout data output control circuit 506 includes an NAND circuit 52a for receiving an internal write enable signal OEM and readout data signal RD4, an inverter circuit 52c for receiving readout data signal RD4, and an NAND circuit 52b for receiving an output of inverter circuit 52c and signal OEM.

Output drive circuit 505 includes a pair of N channel MOS transistors 52f and 52g connected in series between power supply potential $V_{CC}$ and ground potential $V_{SS}$, another pair of N channel MOS transistors 52h and 52i, an inverter circuit 52d connected between NAND circuit 52a and the gate of N channel MOS transistor 52f, and an inverter circuit 52e connected between NAND circuit 52b and the gate of N channel MOS transistor 52g. The gate of N channel MOS transistor 52h is connected to the output of NOR gate circuit 51a. The gate of N channel MOS transistor 52i is connected to the output of NOR circuit gate 51b.

Therefore, in a normal operation mode, the output signal of NAND circuits 52a and 52 both attain an H level when signal OEM attains an L level, whereby N channel MOS transistors 52f and 52g controlled by an inverted signal thereof are both cut off, and input/output terminal 19d connected to the node thereof attains a high impedance state, similar to the first embodiment.

When signal OEM attains an H level and read data RD4 i attains an H level, N channel MOS transistor 52f is rendered conductive, and N channel MOS transistor 52g is cut off, whereby the potential of input/output terminal 19d is pulled up to an H level. When signal OEM attains an H level and readout data RD4 attains an L level, N channel MOS transistor 52f is cut off and N channel MOS transistor 52g is rendered conductive, whereby the potential of input/output terminal 19d is pulled down to an L level.

Thus, when signal OEM attains an L level, input/output terminal 19d attains a high impedance state. When signal OEM attains an H level, the potential of input/output terminal 19d shows a transition according to readout data RD4.

Since the burn-in detection signal attains an active state (L level) in a burn-in mode, transition of operation mode confirmation signal $\phi_{WCBR}$ to an active state (L level) causes the output signal of NOR gate circuit 51a to be driven to an H level and NOR gate circuit 51b to an L level. Therefore, N channel MOS transistor 52h is rendered conductive, and N channel MOS transistor 52i is cut off, whereby the potential of input/output terminal 19d is pulled up to an H level.

When operation mode confirmation signal $\phi_{WCBR}$ attains an L level and burn-in mode detection signal $\phi_{BB}$ attains an inactive state (H level), N channel MOS transistor 52i is rendered conductive, and N channel MOS transistor 52h is cut off, whereby the potential of input/output terminal 19d attains an L level.

According to the above-described structure, confirmation of whether semiconductor memory device 101 is set to a burn-in mode or not from the outside world can be made by rendering operation mode confirmation signal $\phi_{WCBR}$ active by a combination of external control signals to monitor the potential of input/output terminal 19d during a burn-in mode, similar to the first embodiment. Since a composite gate is not present in the transmission path of the signal for controlling the potential of input/output terminal 19d in a normal operation, and the structure is essentially similar to the structure of FIG. 9, the readout speed is not degraded.

In the operation of confirming the operation mode, the potential of input/output terminal 19d does not have to be driven so speedily as in the case of reading out stored data in a normal operation mode. Therefore, the current driving capability of the pair of N channel MOS transistors 52h and 52i can be set smaller than that of the pair of N channel MOS transistors 52f and 52g. The gate width, for example, of the pair of N channel MOS transistors 52h and 52i can be set smaller than the gate width of the pair of N channel MOS transistors 52f and 52g. Thus, increase in the layout area can be suppressed even in the case where another pair of N channel MOS transistors 52h and 52i is provided in addition to the pair of N channel MOS transistors 52f and 52g in output drive circuit 505.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a memory cell array including a plurality of memory cells arranged in a matrix,
    memory cell selection means for reading stored data from a corresponding memory cell in response to an external address signal,
    mode detection means responsive to an operation mode designating signal for detecting designation of a prescribed particular operation mode to render a mode detection signal active,
    operation confirmation means responsive to a concurrently active row address strobe signal, column address strobe signal and write control signal for detecting a request for confirmation of said particular operation mode to render an operation mode confirmation signal active, and
    output buffer means for receiving said stored data read out by said memory cell selection means and said mode detection signal and providing either one thereof according to an external output control signal and said operation mode confirmation signal.

2. The semiconductor memory device according to claim 1, wherein said operation confirmation means responds to a predetermined combination of a plurality of said external control signals for detecting a request of confirming said operation mode to render said operation mode confirmation signal active.

3. The semiconductor memory device according to claim 1, further comprising an internal power supply for receiving an external power supply voltage and supplying a predetermined internal down-converted voltage,
    wherein said internal power supply stops a voltage-down operation according to activation of said mode detection signal.

4. The semiconductor memory device according to claim 1, further comprising an output node of which a potential level is controlled according to a signal to be output,
    wherein said output buffer means sets said output node to a high impedance state when said output control signal and said operation mode confirmation signal are both inactive, sets said output node to a potential according to said stored data when said output control signal is active and said operation mode confirmation signal is inactive, and sets said output node to a potential according to said mode detection signal when said output control signal is inactive and said operation mode confirmation signal is active.

5. A semiconductor memory device comprising:
    a memory cell array including a plurality of memory cells arranged in a matrix,
    memory cell selection means for reading stored data from a corresponding memory cell in response to an external address signal,
    mode detection means responsive to an operation mode designating signal for detecting designation of a prescribed particular operation mode to render a mode detection signal active,
    operation confirmation means responsive to an external control signal for detecting a request for confirmation of said particular operation mode to render an operation mode confirmation signal active, and
    output buffer means for receiving said stored data read out by said memory cell selection means and said mode detection signal and providing either one thereof according to an external output control signal and said operation mode confirmation signal,
    said output buffer means comprising:
        first output control means receiving said stored data for providing a first pair of internal output signals according to said output control signal, said first output control means providing, as said first pair of internal output signals, signals complementary to each other corresponding to said stored data when said output control signal is active, and inactive signals when said output control signal is inactive,
        second output control means for receiving said mode detection signal for providing a second pair of internal output signals according to said operation mode confirmation signal, said second output control means providing, as said second pair of internal output signals, signals complementary to each other corresponding to said mode detection signal when said operation mode confirmation signal is active, and inactive signals when said operation mode confirmation signal is inactive,
        drive signal selection means for receiving said first and second pairs of internal output signals for providing a pair of inactive drive signals when both said first and said second pair of internal output signals are inactive, and a corresponding pair of drive signals complementary to each other when either one of said first and said second pair of internal output signals is active, and
        a first pair of MOS transistors of a first conductivity type having gate potentials controlled by said pair of drive signals, and connected in series between first and second power supplies, and having a node connected to an output node of said output buffer.

6. A semiconductor memory device comprising:
    a memory cell array including a plurality of memory cells arranged in a matrix,
    memory cell selection means for reading stored data from a corresponding memory cell in response to an external address signal,
    mode detection means responsive to an operation mode designating signal for detecting designation of a prescribed particular operation mode to render a mode detection signal active,
    operation confirmation means responsive to an external control signal for detecting a request for confirmation of said particular operation mode to render an operation mode confirmation signal active, and
    output buffer means for receiving said stored data read out by said memory cell selection means and said mode detection signal and providing either one thereof according to an external output control signal and said operation mode confirmation signal,
    said output buffer means comprising:
        first output control buffer means receiving said stored data, and providing a first pair of internal output signals according to said output control signal, said first output control means providing, as said first pair of internal output signals, signals complementary to each other corresponding to said stored data when said output control signal is active, and inactive signals when said output control signal is inactive, second output control means receiving said mode detection signal for providing a second pair of internal signals according to said operation mode confirmation signal, said second output control means providing, as said second pair of internal output signals, signals complementary to each other corresponding to said mode detection signal when said operation mode confirmation signal is active, and inactive signals when said operation mode confirmation signal is inactive, a first pair of MOS transistors of a first conductivity type, having gate potentials controlled by said first pair of internal signals, and connected in series between first and second power supplies, and having a node connected to an output node of said output buffer, and a second pair of MOS transistors of the first conductivity type, having gate potentials controlled by said second pair of internal signals, and connected in series between said first and second power suppies, and having a node connected to said output node.

7. The semiconductor memory device according to claim 6, wherein each gate width of said second pair of MOS transistors is smaller than each gate width of said first pair of MOS transistors.

8. A semiconductor memory device comprising:

a memory cell array including a plurality of cells arranged in a matrix, memory cell selection means for reading stored data from a corresponding memory cell in response to an external address signal, first control means for controlling normal read and write operation from to said corresponding memory cell, second control means responsive to an operation mode designating signal for rendering a mode detection signal active and controlling said semiconductor memory device during a prescribed particular operation mode, and third control means for outputting the state of said mode detection signal to the exterior of said semiconductor memory device after concurrent activation of row address strobe signal, column address strobe signal and write control signal.

9. The semiconductor memory device according to claim 8, further comprising an internal power supply for receiving an external power supply voltage and supplying a predetermined internal down-converted voltage, wherein said internal power supply stops a voltage-down operation according to activation of said mode detection signal.

10. The semiconductor memory device according to claim 8, further comprising a data output terminal, and wherein said third control means includes output buffer means for receiving said stored data read out by said memory cell selection means and said mode detection signal and providing either one thereof to said data output terminal according to an external output control signal and an operation mode confirmation signal.

* * * * *